United States Patent [19]

Hidaka

[11] Patent Number: 4,922,453

[45] Date of Patent: May 1, 1990

[54] BIT LINE STRUCTURE OF DYNAMIC TYPE SEMICONDUCTOR MEMORY DEVICE

[75] Inventor: Hideto Hidaka, Hyogo, Japan

[73] Assignee: Mitsubishi Denki Kabushiki Kaisha, Tokyo, Japan

[21] Appl. No.: 150,373

[22] Filed: Jan. 29, 1988

[30] Foreign Application Priority Data

Feb. 2, 1987 [JP] Japan .................................. 62-22676

[51] Int. Cl.$^5$ ............................................... G11C 5/06
[52] U.S. Cl. ...................................... 365/63; 365/51; 365/190
[58] Field of Search ............... 365/149, 190, 205, 207, 365/208, 51, 63; 357/23.6

[56] References Cited

U.S. PATENT DOCUMENTS

| 4,156,938 | 5/1979 | Proebsting et al. | 365/63 |
|---|---|---|---|
| 4,570,241 | 2/1986 | Arzubi | 365/149 |
| 4,586,171 | 4/1986 | Fujishima | 365/63 |
| 4,692,900 | 9/1987 | Ooami et al. | 365/63 |

OTHER PUBLICATIONS

Arzubi, "Folded Bit Line Connection to Sense Latch", IBM Technical Disclosure Bulletin, vol. 24, No. 9, Feb. 1982, pp. 4800-4801.

Arzubi et al, "One-Device Memory Cell Arrangement with Improved Sense Signals", IBM Technical Disclosure Bulletin, vol. 23, No. 6, Nov. 1980, pp. 2331-2332.

Primary Examiner—Glenn A. Gossage
Attorney, Agent, or Firm—Lowe, Price, Leblanc, Becker & Shur

[57] ABSTRACT

A semiconductor memory device of a folded bit line structure comprises a plurality of bit line pairs in which each bit line pair is divided into a plurality of blocks along a longitudinal direction, and each divided bit line pair is formed by an interconnection layer at a level above a substrate different from the level of an adjacent divided bit line pair in the same block and different from the level of the same bit line pair in an adjacent block.

15 Claims, 6 Drawing Sheets

BIT LINE STRUCTURE OF DYNAMIC TYPE SEMICONDUCTOR MEMORY DEVICE

BACKGROUND OF THE INVENTION

1. Field of the Invention

The present invention relates to an improvement of a bit line structure of a dynamic type semiconductor memory device having a so-called folded bit line structure in which two adjacent bit lines form a pair and an operation of writing/reading data which are complementary with each other is performed through the pair of bit lines.

2. Description of the Prior Art

FIG. 1 shows a whole structure of a typical semiconductor memory device which is used presently.

Referring to FIG. 1, the semiconductor memory device comprises a memory cell array 100 formed of a plurality of memory cells (not shown) arranged in a matrix comprising rows and columns, an address buffer 101 outputting internal row address signals Ao to An and internal column address signals Bo to Bm on receipt of an address signal Ext. ADD externally provided, a row decoder 102 selecting a corresponding word line in the memory cell array 100 in response to the internal row address signals Ao to An received from the address buffer 101, a(n) (I/O+sense amplifier) 104 circuit comprising sense amplifiers each detecting and amplifying a signal appearing on each bit line after the selection of a word line and an I/O portion for providing information detected and amplified by a sense amplifier to an output buffer 103, a column decoder 105 selecting one column of the memory cell array 100 and transferring an information signal on the selected column to the output buffer 103 through the I/O portion of the (I/O+sense amplifier) circuit 104 in response to the internal column address signals Bo to Bm provided from the address buffer 101, and the output buffer 103 receiving an information signal from the column selected by the column decoder 105 through the I/O portion of the (I/O+-sense amplifier) circuit 104 and outputting the same.

In addition, only the main portion of a data reading system is shown in FIG. 1.

FIG. 2 is an enlarged view of the portion surrounded by a dashed line in FIG. 1, showing a structure of a bit line portion of a conventional dynamic type semiconductor memory device. One word line WL and three pairs of bit lines BL0 and $\overline{BL0}$, BL1 and $\overline{BL1}$, and BL2 and $\overline{BL2}$, are respectively shown in FIG. 2.

A pair of bit lines BL0 and $\overline{BL0}$ is provided with a sense amplifier SA0 for detecting and amplifying a potential difference between the bit lines BL0 and $\overline{BL0}$, and with column gates T0 and T0' which are selectively turned on in response to the decoder address signal from a column decoder CD and connects the bit lines BL0 and $\overline{BL0}$ with respective data lines y0 and $\overline{y0}$.

Similarly, each of bit line pairs BL1 and $\overline{BL1}$ and BL2 and $\overline{BL2}$ is provided with sense amplifiers SA1 and SA2 and column gates T1 and T1' and T2 and T2', respectively.

Each of the bit line pairs constitutes a so-called folded bit line structure. Therefore, a memory cell MC is disposed at an intersection point of one word line and either bit line of a pair of bit lines. Referring to a structure in FIG. 2, the case is shown in which the memory cells MC are disposed at each of the intersection points of the word line WL and the bit lines BL0, BL1 and BL2. Each memory cell comprises a capacitor C storing information in the form of electric charges and a transfer gate Tr connecting the capacitor C to the corresponding bit line in response to the potential of the word line.

The bit lines BL0 and $\overline{BL0}$ are provided with the column selecting gates T0 and T0' which become conductive selectively in response to the column decoder CD output and connect the bit lines BL0 and $\overline{BL0}$ to the data lines y0 and $\overline{y0}$, respectively.

Similarly, the bit lines BL1 and $\overline{BL1}$ are provided with column selecting gates T1 and T1' and bit lines BL2 and $\overline{BL2}$ are provided with column selecting gates T2 and T2', respectively.

In the above structure, the column decoder CD is equivalent to the column decoder 105 shown in FIG. 1.

In a bit line structure as mentioned above, a pair of bit lines is selected by the column decoder CD output (that is, column decoder signal) and connected to the data lines y0 and $\overline{y0}$.

Each bit line has a parasitic capacitance C0. A coupling capacitance C2 exists between the bit lines constituting a pair of bit lines and a coupling capacitance C1 exists between the bit lines of adjacent bit line pairs. For example, the bit line BL1 has the parasitic capacitance C0 associated with itself and the coupling capacitances C2 and C1 between itself and adjacent bit lines $\overline{BL1}$ and $\overline{BL0}$, respectively. Referring to FIGS. 1 and 2. an operation of reading data is briefly described.

On entering an active cycle of the memory device, the external address signal Ext. ADD is received by the row address buffer 101 and the internal row address signals Ao to An are generated and provided to the row decoder 102. The row decoder 102 decodes the received internal row address signals Ao to An and selects one word line. As a result, the potential of the selected word line rises and then information stored in the memory cells connected to the selected word line is read out onto each corresponding bit line. In FIG. 2, let it be assumed that the word line WL is selected and information is read out onto each of bit lines BL0, BL1 and BL2. At this time, a signal voltage to be read out, that is, a potential difference between a pair of bit lines is determined to be a read voltage $\Delta$Vo+coupling noise voltage $\Delta$Vc.

The read voltage $\Delta$Vo is a voltage value which is determined by the ratio $C/C_B$ of a capacitance C of the memory cell capacitor to a bit line capacitance $C_B$ ($C_B$=C0+C1+C2). The coupling noise voltage $\Delta$Vc is the noise voltage which is received from the adjacent bit line through the coupling capacitances C1 and C2 and has a component proportional to $C1/C_B$ (i.e., a noise component from a bit line of the adjacent bit line pairs) and a component proportional to $C2/C_B$ (i.e., a capacitance coupling noise component from the paired bit line). The coupling noise $\Delta$Vc is the noise component derived from capacitance coupling, which becomes either positive or negative in response to a signal level ("H" or "L") on the bit line of the adjacent bit line pair and which operates to decrease the read voltage $\Delta$Vo in the worst case. For example, for 1M DRAM (dynamic random access memory), the ratio of $C1/C_B$ to a potential difference of a bit line pair reaches as much as 20%.

Thereafter, each of sense amplifiers SA0, SA1 ... is activated to detect and amplify a potential difference between each pair of bit lines.

It is desirable to make the potential difference between a pair of bit lines as large as possible so that the sense amplifier can have a large sensing margin. However, with a demand for higher integration of a semiconductor memory device, space between bit lines becomes smaller and accordingly the coupling capacitance C1 between adjacent bit line pairs becomes larger and a value of $C1/C_B$ becomes larger. More specifically, the influence of a potential on the bit line of the adjacent bit line pair becomes larger and sometimes the read voltage $\Delta Vo$ onto a bit line is seriously damaged so that a potential difference of a bit line pair would become smaller. In such case, a sense amplifier can not detect and amplify the potential difference of the bit line pair accurately, causing malfunction, and soft error rate is increased.

SUMMARY OF THE INVENTION

A primary object of the present invention is to remove the above-mentioned defects of a conventional semiconductor memory device. More specifically, a primary object of the present invention is to provide a semiconductor memory device in which even if the spacing between bit lines becomes smaller, the coupling noise component is not increased, whereby enough margin for a read operation can be insured.

A semiconductor memory device according to the present invention comprises a plurality of bit line pairs, each bit pair being divided into a plurality of blocks in a longitudinal direction, bit lines included in adjacent blocks being formed of different level interconnection layers with each other.

In the above-mentioned structure, since adjacent bit line blocks are formed of different interconnection layers, the pitch between two adjacent bit line pairs can be made larger than the structure in which the bit lines are formed of the same interconnection layer, whereby the noise component through the coupling capacitance between the adjacent bit line pairs can be decreased.

These and objects, features, aspects and advantages of the present invention will become more apparatus from the following detailed description of the present invention when taken in conjunction with the accompanying drawings.

DESCRIPTION OF THE PREFERRED EMBODIMENTS

Figure 1:
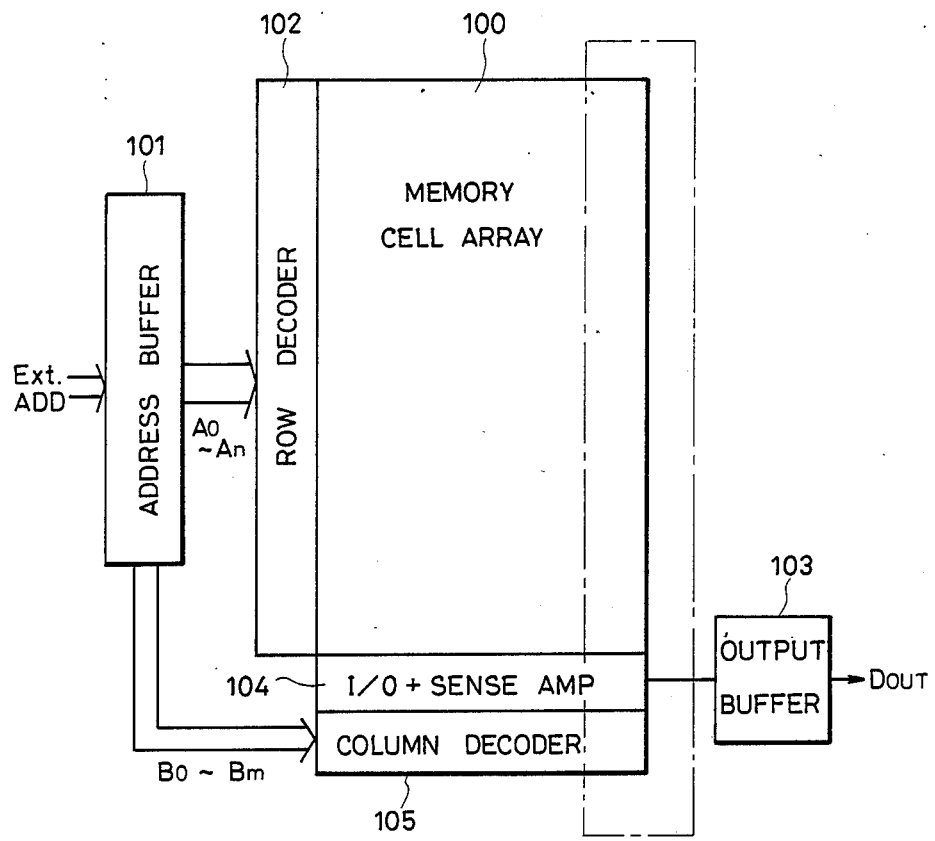
FIG. 1 is a diagram showing a schematic structure of a conventionally used semiconductor memory device.
Figure 2:
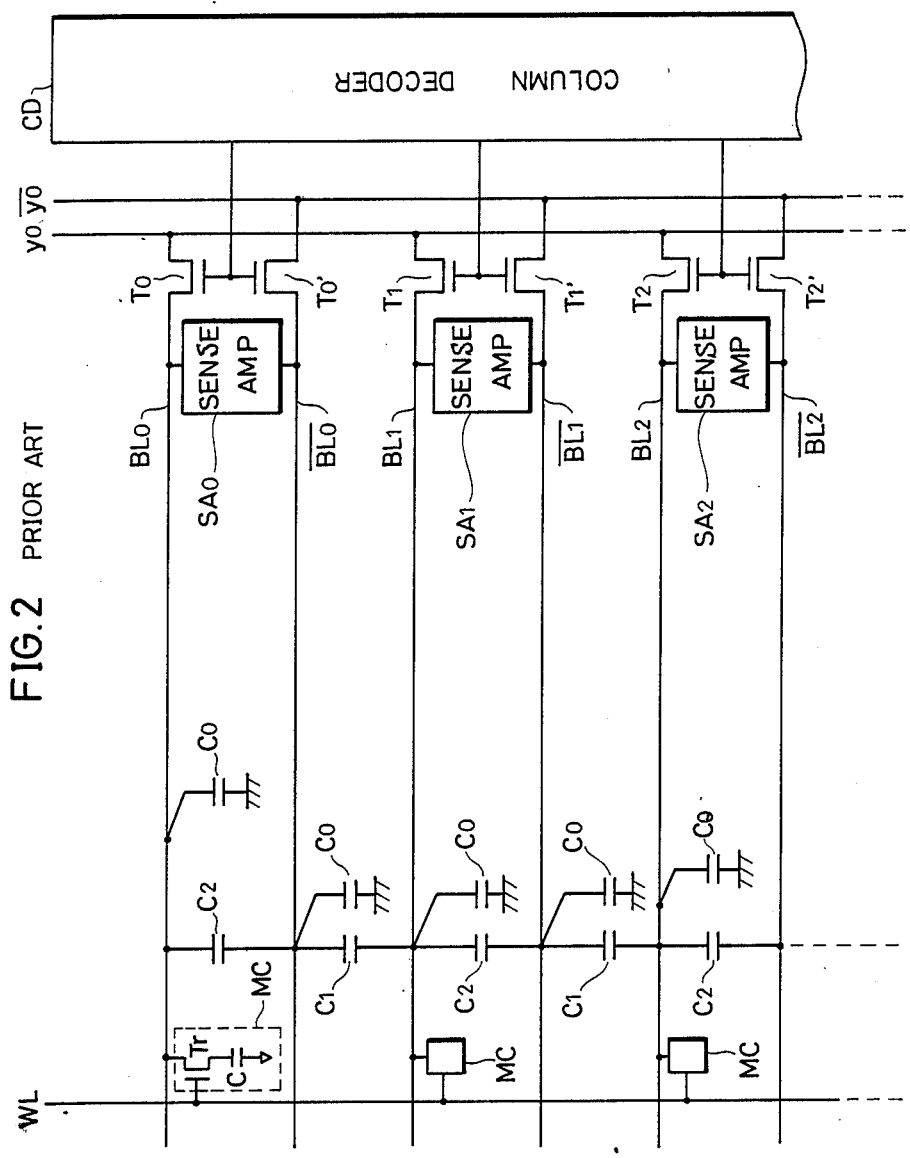
FIG. 2 is a diagram showing a structure of a bit line portion of a conventional semiconductor memory device.
Figure 3:
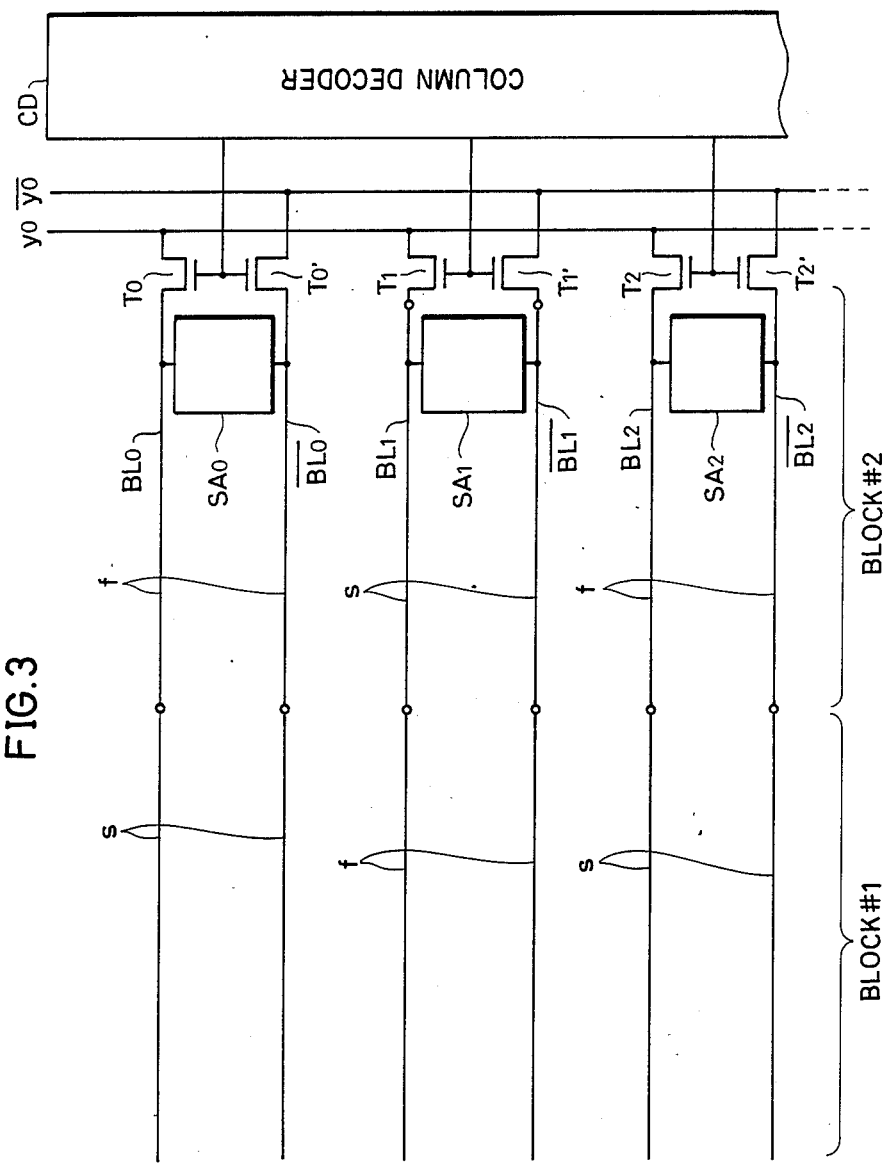
FIG. 3 is a diagram showing a schematic structure of a bit line portion of a semiconductor memory device according to one embodiment of the present invention.

FIG. 3 is a diagram showing a structure of a bit line portion of a semiconductor memory device of one embodiment of the present invention. Referring to FIG. 3, the same references are allotted to the same or corresponding portions as the structure of the conventional semiconductor memory device shown in FIG. 2. In a bit line structure shown in FIG. 3, each of bit line pairs BL0 and $\overline{BL0}$, BL1 and $\overline{BL1}$, and BL2 and $\overline{BL2}$ is divided into two blocks, BLOCK#1 and BLOCK#2, along a longutudinal direction. Each divided bit line pair is formed of an interconnection layer which is different from an interconnection layer of a divided bit line pair in an adjacent block. More specifically, the bit line pair BL0 and $\overline{BL0}$ is divided into two and the divided bit line pair belonging to BLOCK#1 is formed of a second level aluminum interconnection layer s and the divided bit line pair belonging to BLOCK#2 is formed of a first level aluminum interconnection layer f. For the bit line pair BL1 and $\overline{BL1}$, the divided bit line pair belonging to BLOCK#1 is formed of the first level aluminum interconnection layer f and the divided bit line pair belonging to BLOCK#2 is formed of the second level aluminum interconnection layer s. Similarly, for the bit line pair BL2 and $\overline{BL2}$, the divided bit line pair belonging to BLOCK#1 is formed of the second level aluminum interconnection layer s and the divided bit line pair belonging to BLOCK#2 is formed of the first level aluminum interconnection layer f. The first and second levels of the interconnection layers are made of the same material but by different manufacturing steps. The interconnection layer closer to the semiconductor substrate is referred to as the first level interconnection layer and the interconnection layer formed using the same process such as a CVD or sputtering process after the formation of the first level interconnection layer is referred to as the second level interconnection layer. More specifically, the first level interconnection layer is formed and then the first level interconnection layer is covered with an insulating film and the second level interconnection layer is formed on the insulating layer. Such an interconnection structure is implemented using the conventional multi-level interconnection technique.

In the above-mentioned structure, the divided bit line pair formed of the second level aluminum interconnection layer s and the divided bit line pair formed of the first level aluminum interconnection layer f are arranged alternately at BLOCK#1. Meanwhile, the divided bit line pair formed of the first level aluminum interconnection layer f and the divided bit line pair formed of the second level aluminum interconnection layer s are arranged alternately at BLOCK#2.

Figure 4A:
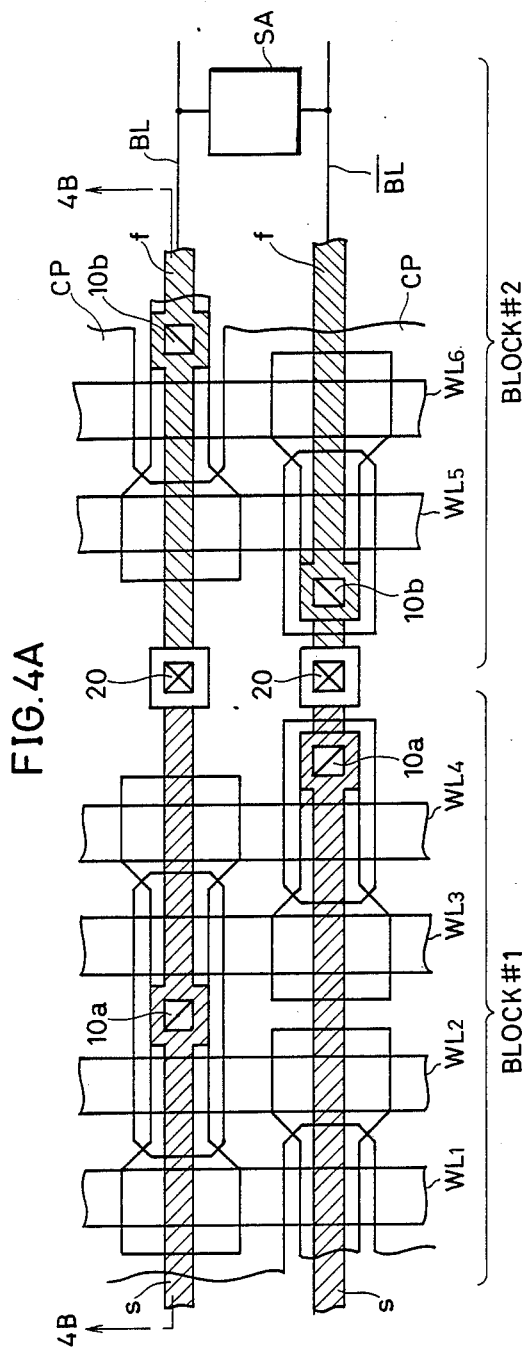
FIG. 4A is a diagram showing a plane arrangement of a pair of bit lines of a semiconductor memory device according to one embodiment of the present invention.

FIG. 4A is a diagram showing a plane arrangement of a pair of bit lines of a semiconductor memory device of one embodiment of the present invention, in which a memory cell capacitor is structured as a planar type capacitor.

Referring to FIG. 4A, word lines WL1 to WL6 are arranged in parallel with each other so as to orthogonally cross the bit lines BL and $\overline{BL}$. Each of word lines WL1 to WL6 has a function of a gate electrode of a transfer gate transistor comprised in a memory cell and it is formed of, for example, polycrystalline silicon (referred to as polysilicon hereinbelow). The divided bit line pair belonging to BLOCK#1 of bit lines BL and $\overline{BL}$ is formed of the second level aluminum interconnection layer s and connected electrically to an active region (source region) of the transfer gate transistor in the corresponding memory cell through a contact hole 10a. The divided bit line pair belonging to BLOCK#2 is formed of the first level aluminum interconnection layer f and connected electrically to the corresponding memory cell through a contact hole 10b. The first level aluminum interconnection layer f and the second level aluminum interconnection layer s are connected with each other electrically through a contact hole 20.

Figure 4B:
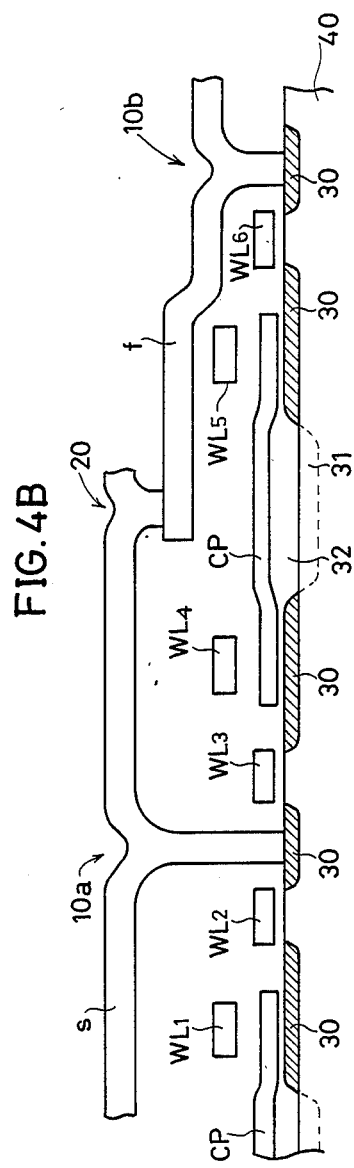
FIG. 4B is a diagram showing a sectional structure along one bit line in a semiconductor memory device according to one embodiment of the present invention.

FIG. 4B is a diagram showing a sectional structure of one bit line of a semiconductor memory device in accordance with the present invention and showing a sectional structure taken along the line 4B—4B in FIG. 4A.

Referring to a structure of FIG. 4B, the memory cell has a planar type capacitor memory cell structure and comprises an impurity region 30, a word line WL and a cell plate (one electrode of the memory cell capacitor) formed above the impurity region 30 with an insulating film interpose therebetween. Adjacent memory cells are isolated electrically by an impurity region 31 (a region having an opposite conductivity type of the impurity region 30 and having the same conductivity type as the semiconductor substrate 40) serving as a channel stop layer and a field insulating film 32 on the impurity region 31.

A cell plate cp is formed of the first level polysilicon layer and each of the word lines WL1 to WL6 is formed of second polysilicon layers at two different levels above the substrate.

As shown most obviously in FIG. 4B, since each divided bit line pair is formed of an interconnection layer which is different from the interconnection layer of adjacent divided bit line, that is, in a layer different from that of adjacent bit line pairs and in a layer different from that of adjacent portions of the same bit line pair, the pitch between two adjacent bit line pairs becomes longer and accordingly the capacitance between the adjacent bit line pairs (the capacitance C1 in FIG. 2) can be small as compared with the conventional case in which all bit lines are formed of the same level interconnection layer. Therefore, coupling noise provided from the bit lines of the adjacent bit line pair to the read voltage at the time of reading memory cell information can be decreased, and even if the space (pitch) between bit lines becomes smaller with higher integration, a stable sensing operation can be secured.

Since each bit line pair is divided into two blocks of substantially the same length and the divided bit line pair of one block is formed of the first level aluminum interconnection layer f and the divided bit line pair of the other block is formed of the second level aluminum interconnection layer, stray capacitance Co and resistance associated with each bit line are all the same and thus, the speed of a potential change on each bit line pair at the time of an operation of a sense amplifier can be made equal at all bit lines and consequently, an influence of the capacitance coupling noise from the adjacent bit line pair due to the difference in the speed of a potential change can be removed and the margin of a reading operation can be not damaged.

Figure 5:
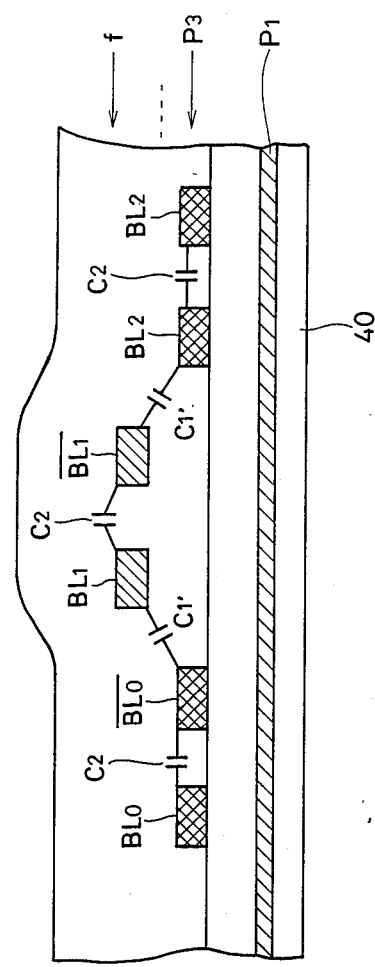
FIG. 5 is a diagram showing a sectional structure of a bit line portion of a semiconductor memory device according to another embodiment of the present invention.

FIG. 5 is a sectional view showing a structure of a bit line of a semiconductor memory device according to another embodiment of the present invention. Referring to the structure of FIG. 5, each of the bit line pairs is divided into a plurality of blocks, the divided bit line pair of each block is formed of either a third level polysilicon interconnection layer or the first level aluminum interconnection layer, the divided bit line pairs of the adjacent blocks are formed of different level interconnection layers and the divided bit line pairs belonging to the same level interconnection layer are disposed so as not to adjoin each other. A first level polysilicon layer P1 forms the cell plate cp forming one electrode of the memory cell capacitor and a second level polysilicon layer P2 (not shown in FIG. 5) constitutes the gate electrode of the transfer gate transistor of the memory cell, that is, the word line. In this structure, since the bit lines of the adjacent bit line pairs are formed of different interconnection layers (the first level aluminum interconnection layer f and the third level polysilicon layer), the pitch between two adjacent bit line pairs does not become small even if the spacing between bit lines becomes small with higher integration of the memory device, and as a result, the capacitance C1' between the adjacent bit line pairs can be made smaller and the same effect can be obtained as the case of the bit line structure shown in FIG. 3.

Figure 6:
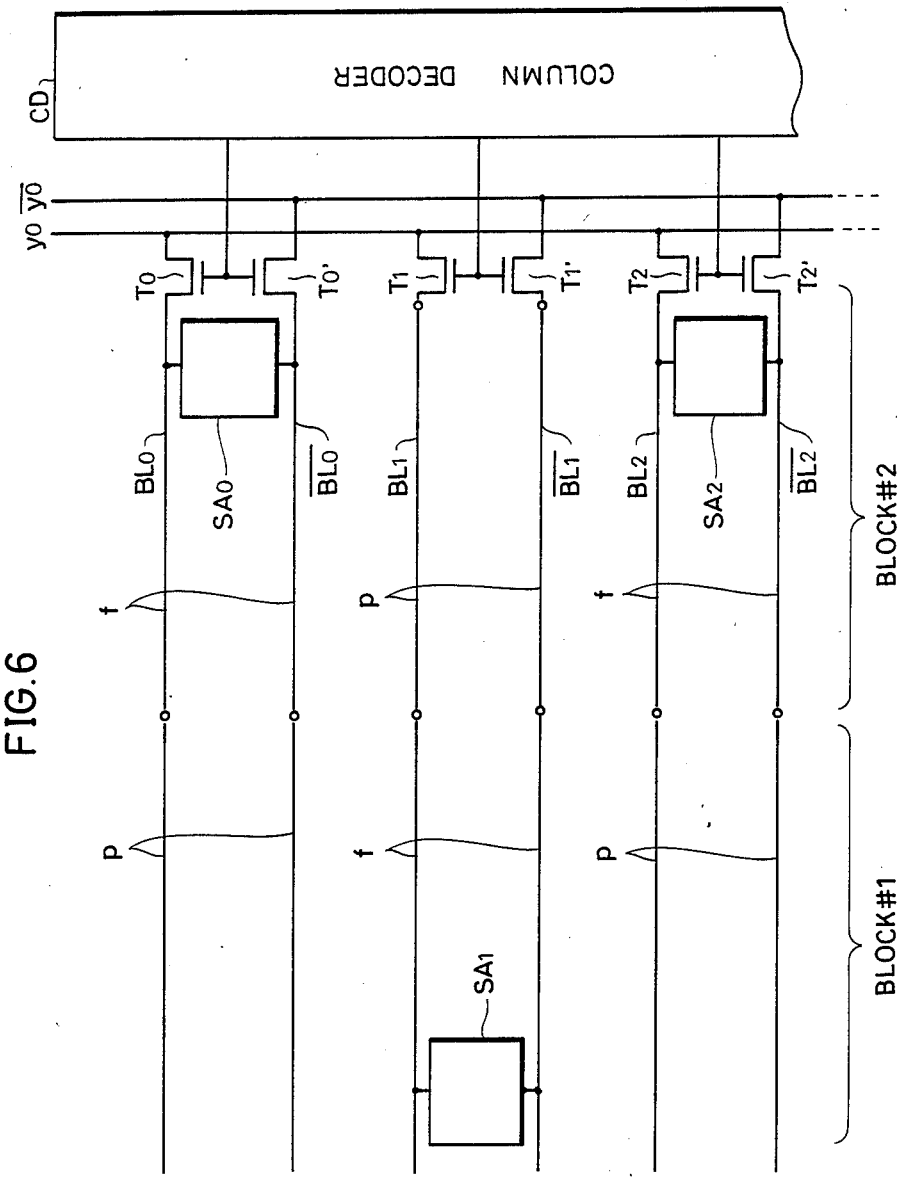
FIG. 6 is a diagram showing a structure of a bit line portion of a semiconductor memory device according to still another embodiment of the present invention.

FIG. 6 is a diagram showing a structure of a bit line portion of a semiconductor memory device of still another embodiment of the present invention. Referring to a structure of FIG. 6, each bit line pair is divided into BLOCK#1 and BLOCK#2 of about the same length and the divided bit line pair belonging to each block is formed of either the first level aluminum interconnection layer f or the third level polysilicon interconnection layer p so as to meet conditions that the adjacent divided bit line pairs are formed of the different interconnection layer levels. A sense amplifier provided for each bit line pair is provided at either end of the bit line pair so as to be connected to the divided bit line pair formed of the first level aluminum interconnection layer.

The sense amplifiers are arranged at either end portion of the bit line pairs alternately for the following reason.

That is, the polysilicon interconnection layer has a resistance value larger than that of the aluminum interconnection layer. Therefore, in the case in which the sense amplifiers are disposed at only one end of each bit line pair like the conventional device, if all sense amplifiers are activated simultaneously at the time of an active operation of sense amplifiers (at the time of detecting and amplifying a potential difference between each of the bit line pairs), the potential difference between the divided bit line pairs formed of the aluminum interconnection layer increases faster than the potential difference between the adjacent divided bit line pairs formed of the polysilicon interconnection layer because polysilicion has a higher resistance than aluminum. As a result, since the divided bit line pair formed of the aluminum interconnection layer in which the potential difference increases faster and the divided bit line pair formed of the polysilicon interconnection layer in which the potential difference increases slowly are adjacent to each other, influence of noise received through the capacitance coupling on the divided bit line pair formed of the aluminum interconnection layer is larger than that on the divided bit line pair formed of the polysilicon interconnection layer.

However, as shown in FIG. 6, if each of the sense amplifiers SA0 to SA2 is provided on the divided bit line pairs formed of the aluminum interconnection layer, the increasing speed of a signal on each bit line pair becomes the same and speed of the potential difference can be faster than the case in which the sense amplifiers are provided on the divided bit lines formed of the polysilicon interconnection layer and as result, the influence of capacitance coupling noise from adjacent bit line pairs caused by the difference in the increasing speed of the potential difference can be prevented and also the margin of a reading operation can be prevented from decreasing.

In the sense amplifiers are arranged on the either end of the bit line pairs alternately, a layout pitch for the sense amplifier can be doubled, which is of advantage to the layout.

In the above-described embodiment, although the case is shown in which the memory cell has a planar type capacitor, a semiconductor memory device formed of other type memory cells, such as memory cells with trench type capacitor, can be also submitted to application of the present invention.

In the above-mentioned embodiment, although the case is shown in which each bit line pair is divided into two at about the center portion and the sense amplifier is provided at the end of each bit line pair, the number and position of regions dividing the bit line pairs and the position of the sense amplifier are not limited to this case.

Also, in the above-described embodiment, although the divided bit line pairs are formed of the first level aluminum interconnection layer, the second level aluminum interconnection layer and the third level polysilicon interconnection layer, the level of the interconnection layer can be appropriately changed in accordance with a structure of a memory device applied. For example, the second level polysilicon layer may be used.

As described above, in accordance with the present invention, since each bit line pair is divided into a plurality of blocks along a longitudinal direction and each divided bit line pair is formed of the interconnection layers at different levels from that of the divided bit line pairs in adjacent blocks, coupling capacitance between the adjacent bit line pairs can be decreased and therefore, capacitance coupling noise from adjacent bit line pairs can be decreased, stable sensing operation can be implemented and the margin of the reading operation can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An improvement of a bit line structure in a semiconductor memory device having a folded bit line structure, comprising:
    a substrate;
    a plurality of bit line pairs each divided into a plurality of blocks of bit line pairs along a longitudinal direction of said substrate;
    wherein each divided bit line pair within a common block is formed by an interconnection layer at a level above said substrate which is different from the level of an adjacent divided bit line pair in the same block and different from the level of the same bit line pair in an adjacent block.

2. The improvement of claim 1, wherein sense amplifiers of successive bit line pairs are located in different blocks.

3. The improvement of claim 1, wherein portions of each of said divided bit line pairs in successive blocks are located alternately at first and second different levels above said substrate, and further wherein successive bit line pairs in a common block are located alternately at said first and second different levels above said substrate.

4. The improvement of claim 1, wherein each of said bit line pairs is formed of the same conductive material.

5. The improvement of claim 1, wherein each divided bit line pair in one block is made of a conducting material different from the conducting material of an adjacent divided bit line pair in the same block.

6. The improvement of claim 1, wherein sense amplifiers are connected respectively to adjacent bit line pairs in a common block at different levels above said substrate.

7. The improvement of claim 1, wherein portions of each of said divided bit line pairs at said first and second levels above said substrate are made respectively of different conducting materials, and wherein sense amplifiers are connected respectively to common conductiing materials of said bit line pairs.

8. The improvement of claim 7, wherein sense amplifiers of successive bit line pairs are located alternately in successive blocks.

9. The improvement of claim 7, wherein one of said conducting materials is aluminum, and said sense amplifiers are connected to portions of said divided bit line pairs formed of aluminum.

10. The improvement of claim 9, wherein other portions of each of said divided bit line pairs are formed of polysilicon.

11. The improvement of claim 9, wherein portions of each of said divided bit line pairs in a common block are formed of the same conducting material.

12. A folded-bit line type semiconductor memory device, comprising:
    a substrate;
    a plurality of word lines formed on an insulator disposed on said substrate;
    a plurality of bit line pairs crossing said plurality of word lines, memory cells provided at crossings of said pluralities of word lines and bit line pairs;
    row decoder means responsive to an external address signal for selecting one word line out of said plurality of word lines;
    column decoder means responsive to said external address signal for selecting one bit one pair out of said plurality of bit line pairs;
    said plurality of bit line pairs being divided longitudinally into a plurality of blocks of bit line pairs;
    a plurality of sense amplifiers connected respectively to said plurality of bit line pairs for amplifying a potential difference between the bit lines of corresponding bit line pairs;
    the bit lines of a first one of said bit line pairs in one of said plurality of blocks being located at a common first level above said substrate;
    the bit lines of a second one of said bit line pairs in said one block of said plurality of blocks adjacent said first one of said bit line pairs and the bit lines of said first one of said bit line pairs in an adjacent block being located at a common second level different from said first level above said substrate.

13. An improvement of a bit line structure in a semiconductor memory device having a folded bit line structure, comprising:

a substrate;

a plurality of bit line pairs comprising odd bit line pairs and even line pairs above said substrate;

the bit lines of said odd bit lines having a first portion thereof located at a common first level above said substrate and an adjacent second portion thereof located at a common second level above said substrate different from said first level;

the bit lines of said even bit line pairs having a first portion thereof adjacent, and located at a different level above said substrate from, the first portion of the bit lines of at least one of said odd bit line pairs and a second portion thereof adjacent, and located at a different level above said substrate from, the second portion of the bit lines of said at least one of said odd bit line pairs;

said first and second portions of the bit lines of said odd bit line pairs being located at different levels above said substrate; and said first and second portions of the bit lines of said even bit line pairs being located at different levels above said substrate.

14. The improvement of claim 13, including first sense amplifiers respectively connected to said first portions of said odd bit line pairs and second sense amplifiers respectively connected to said second portions of said even bit line pairs.

15. The improvement of claim 14, including first sense amplifiers respectively connected to said first portions of said even bit line pairs and second sense amplifiers respectively connected to said second portions of said odd bit line pairs.

* * * * *